(12) United States Patent
Wang et al.

(10) Patent No.: US 12,149,254 B2
(45) Date of Patent: Nov. 19, 2024

(54) LOW-NOISE MILLIMETER-WAVE FRACTIONAL-N FREQUENCY SYNTHESIZER

(71) Applicant: Univ. Electronic Science and Technology of China, Chengdu (CN)

(72) Inventors: Zheng Wang, Chengdu (CN); Xinlin Geng, Chengdu (CN); Zonglin Ye, Chengdu (CN); Yao Xiao, Chengdu (CN); Qian Xie, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 65 days.

(21) Appl. No.: 18/321,017

(22) Filed: May 22, 2023

(65) Prior Publication Data

US 2023/0387925 A1 Nov. 30, 2023

(30) Foreign Application Priority Data

May 27, 2022 (CN) .......................... 202210600105.5

(51) Int. Cl.
*H03L 7/197* (2006.01)
*H03L 7/093* (2006.01)

(52) U.S. Cl.
CPC ............ *H03L 7/1974* (2013.01); *H03L 7/093* (2013.01); *H03L 2207/50* (2013.01)

(58) Field of Classification Search
CPC .... H03L 7/1974; H03L 7/093; H03L 2207/50
See application file for complete search history.

(56) References Cited

U.S. PATENT DOCUMENTS

| | | | |
|---|---|---|---|
| 8,804,873 B1 * | 8/2014 | McCallister | H04L 1/0042 375/296 |
| 8,817,867 B1 * | 8/2014 | Annampedu | H04L 27/01 375/233 |

(Continued)

FOREIGN PATENT DOCUMENTS

| | | | | |
|---|---|---|---|---|
| CN | 110365333 A | * | 10/2019 | H03L 7/0992 |
| CN | 115001489 A | * | 9/2022 | H03L 7/093 |
| KR | 20150045124 A | * | 4/2015 | |

*Primary Examiner* — Adam D Houston
(74) *Attorney, Agent, or Firm* — Andrew D. Fortney; Central California IP Group, P.C.

(57) ABSTRACT

The disclosure relates to mixed analog-digital circuits, and more specifically a low-noise millimeter-wave fractional-N frequency synthesizer. It overcomes quantization noise and fractional spurs caused by the limited dynamic range and nonlinearity of time error amplifiers (TA) in traditional phase-locked loop structures based on TA. In addition to the traditional structure, the synthesizer includes a coarse digital-to-time converter (CDTC), a fine digital-to-time converter (FDTC), and DTC non-linearity calibration circuits. By inserting the CDTC and FDTC before and after the TA, respectively, the variance of the input phase difference of the TA can be reduced, thereby improving the TA linearity and suppressing the quantization noise and spur generated by fractional-N operation. Furthermore, by using non-linearity calibration, the non-linearity of DTC and TA can be compensated to avoid large quantization noise and spur while the second order quantization noise reshaping is maintained. Furthermore, a high-gain TA can increase the resolution of the FDTC.

20 Claims, 4 Drawing Sheets

(56) References Cited

U.S. PATENT DOCUMENTS

| | | | |
|---|---|---|---|
| 9,397,675 B1* | 7/2016 | Goodson | H03L 7/18 |
| 10,715,151 B2* | 7/2020 | Jin | H03K 5/24 |
| 11,038,513 B1* | 6/2021 | Moore | H03L 7/099 |
| 11,101,810 B1* | 8/2021 | Veldhoven | H03M 1/0626 |
| 11,456,792 B1* | 9/2022 | Comberiate | H04L 25/0204 |
| 2001/0033200 A1* | 10/2001 | Staszewski | H03L 7/18 |
| | | | 331/25 |
| 2004/0004674 A1* | 1/2004 | Birleson | H03D 7/1491 |
| | | | 348/731 |
| 2012/0013494 A1* | 1/2012 | Song | H03M 1/0641 |
| | | | 341/122 |
| 2019/0280758 A1* | 9/2019 | Wloczysiak | H04B 7/0817 |
| 2023/0238981 A1* | 7/2023 | van Veldhoven | H03M 3/344 |
| | | | 341/143 |
| 2023/0387925 A1* | 11/2023 | Wang | H03L 7/093 |

\* cited by examiner

LOW-NOISE MILLIMETER-WAVE FRACTIONAL-N FREQUENCY SYNTHESIZER

TECHNICAL FIELD

The present invention belongs to the field of mixed-signal circuits, and relates to a phase-locked loop structure. Specifically, it provides a low noise millimeter-wave fractional-N synthesizer phase-locked loop structure based on time error amplifier and digital time converter.

BACKGROUND

With the advent of 5G communication technology, the noise performance requirements for clock sources in wireless communication systems are becoming increasingly high. Low noise frequency synthesizers are a prerequisite for various applications. In addition, in order to ensure that the frequency can be finely adjusted within a certain range, the phase-locked loop needs to support fractional-N operation.

The noise of a phase-locked loop is usually composed of in-band noise and out-of-band noise, which are in a trade-off relationship. When a larger loop band width is used, the contribution of in-band noise to the output noise of the phase-locked loop will increase, while the contribution of out-of-band noise to the output noise of the phase-locked loop will decrease. Since the phase-locked loop based on time amplifier (TA) can effectively suppress the noise of charge pump (CP) (the main contributor to in-band noise in integer mode), if the quantization noise of fractional-N division can be effectively suppressed (another main contributor to in-band noise in fractional mode), a larger bandwidth can be used to suppress the noise of voltage-controlled oscillator (VCO) (the main contributor to out-of-band noise). However, the traditional method of implementing fractional-N operation based on delta-sigma modulator (DSM) frequency dividers has large quantization noise and the deep-distorted residue coming with inherent small dynamic range and large non-linear limitations of TA leads to significant aggregation in noise and spurs.

SUMMARY OF THE INVENTION

One objective of the present invention is to provide a low-noise millimeter-wave fractional-N frequency synthesizer based on a TA and two digital-to-time converters (DTC) to overcome the spur and quantization noise degradation caused by the small dynamic range and large non-linearity of the TA in traditional TA-based phase-locked loop (PLL) structures. This invention improves and calibrates the linearity of the TA while suppressing the quantization noise generated from fractional division by inserting a Coarse DTC (CDTC) and a Fine DTC (FDTC) before and after the TA, respectively. The adoption of the CDTC can reduce the variance of the input phase difference and thereby improve TA's linearity. And the adoption of the FDTC can further r educe quantization noise and compensate TA's non-linearity.

To achieve the above-mentioned purpose, the technical solution adopted by the present invention is as follows:

A low noise millimeter-wave fractional-N frequency synthesizer includes: a phase-frequency detector (PFD), a time amplifier (TA), a charge pump (CP), a loop filter (LF), a voltage-controlled oscillator (VCO), a divider and a delta-sigma modulator (DSM), wherein it further includes a coarse digital-to-time convertor (CDTC), a fine digital-to-time convertor (FDTC) and 2 digital non-linearity calibration circuits. An input of the CDTC is connected to an output of the divider and an output of CDTC is connected to an input of PFD. An input of the FDTC is connected to an output of the TA and an output of the FDTC is connected to an input of the CP. The digital non-linearity calibration circuits comprise a first non-linearity calibration module, a second non-linearity calibration module and a Bang-Bang phase detector (BBPD). An output signal $\varphi_{fdtc}$ of the FDTC is connected to an input of the Bang-Bang phase detector, and the Bang-Bang phase detector extracts the phase error information of $\varphi_{fdtc}$ and connects it to the first DTC non-linearity calibration module and the second DTC non-linearity calibration module. The extracted phase error information is used to up date one or both non-linearity calibration modules. The first non-linearity calibration module generates a control code for the CDTC and the control code is connected to a control terminal of the CDTC. The second non-linearity calibration module generates a control code for the FDTC and the control code is connected to a control terminal of the FDTC.

In an embodiment, an input signal $f_{in}$ is connected to a crystal oscillator signal input of the PFD in the phase-locked loop, the output signal of the CDTC is connected to the input of the PFD (divider side), the output signal $\varphi_{pfd}$ of the PFD is connected to the input of the TA to generate an output signal $\varphi_{ta}$, and $\varphi_{ta}$ is connected to the input of the FDTC, which generates an output signal $\varphi_{fdtc}$ and is connected to the input of the CP. The CP generates an output current signal and converts it to a voltage signal $V_{tune}$ by the loop filter, and the voltage signal $V_{tune}$ is connected to the control terminal of the VCO. The VCO generates an output signal $f_{out}$. Meanwhile, the output signal $f_{out}$ is fed back to the input of the divider, and the divider generates a divided frequency signal $f_{div}$ which is connected to the input of the CDTC and serves as the clock for digital circuits to drive the DSM. The DSM generates a corresponding phase residual information $\varphi_{dsm}$ and a control signal $N_{div}$ which are connected to a phase residual input of the first DTC non-linearity calibration module and a control terminal of the divider, respectively.

Furthermore, the first DTC non-linearity calibration module comprises: a first DTC compensation module and a first DTC calibration module; wherein the first DTC compensation module comprises: a first lookup table, a first threshold calculation module, a first arrayed comparator and a first encoder. The first lookup table stores a delay data for each control word of the corresponding CDTC. The first threshold calculation module calculates an average value of each adjacent delay data in the first lookup table and outputs the average value of its calculation result as thresholds. The first arrayed comparator compares each threshold with the phase residue $\varphi_{dsm}$ input from the DSM and an arrayed output is sent to the first encoder. The first encoder (which can be formed by a priority encoder or an adder) selects a delay data $D_{clut}$ in the first lookup table which is closest to the phase residue $\varphi_{dsm}$ and outputs a control word corresponding to the delay data $D_{clut}$ as the CDTC control signal. At the same time, the phase residue $\varphi_{dsm}$ minus the delay data $D_{clut}$ is output as a phase residue output $D_{cdtc}$ of the first DTC compensation module which can be used as an input of the second DTC compensation module.

The second DTC non-linearity calibration module includes: a second DTC compensation module and a second DTC calibration module; wherein the second DTC compensation module includes: a second lookup table, a second threshold calculation module, a second arrayed comparator, and a second encoder. The second lookup table stores delay data for each control word of the corresponding FDTC, and the second threshold calculation module calculates an average value of each adjacent delay data in the second lookup table and outputs a calculation result as thresholds. A phase residual output $D_{cdtc}$ of the first DTC compensation module is added to a current residual $R_{dsm}$ to obtain a pre-compared value $D_c$. $D_c$ is compared with each threshold to get a comparison result, and the comparison result is input to the second encoder similar to that in the first module. The second encoder selects the delay data $D_{fdtc}$ closest to the compared value De in the second lookup table and outputs a control signal of the FDTC corresponding to the control word of the delayed data $D_{fdtc}$; at the same time, the compared value De minus the delayed data $D_{flut}$ is used as the phase residual $R_{dsm}$ of the next period. The phase residual output $D_{cdtc}$ minus the delayed data $D_{flut}$ is used as a phase residual output $D_{fdtc}$ of the second DTC non-linearity compensation module and also is connected to the second DTC calibration module and the first DTC calibration module.

Furthermore, both the first DTC calibration module and the second DTC calibration module are in the same structure. The sign bit of the phase residue output $D_{fdtc}$ of the second DTC non-linearity calibration module is compared with the out put of the BBPD. When they are different, the first lookup table and the second look up table are updated: if the output of the BBPD is 1, the delay data $D_{clut}$ in the first lookup table and the delay data $D_{flut}$ in the second lookup table are increased according to a preset step size; if the output of the BBPD is 0, the delay data $D_{clut}$ in the first lookup table and the delay data $D_{flut}$ in the second lookup table are decreased according to a preset step size.

The advantage of present invention is that:

The DTC is configured to achieve digital phase-domain compensation for the quantization error residue of the delta-sigma modulation (DSM). At the same ti me, compensation for the quantization error reduces the input phase jitter of the time amplifier (TA), enabling TA to be designed with higher gain and high linearity, thereby reducing in-band noise of the phase-locked loop. Ultimately, this invention achieves quantization noise less than −170 dBc/Hz.

The 2 non-linearity calibrations are used to reduce spur while keeping n on-linear 2nd noise shaping for quantization error. The proposed 2 non-linearity calibrations are cascadable, thus making it to be used in the present phase locked loop with two DTCs.

The input-referred resolution of the FDTC is finer than its physical resolution due to the reused high-gain TA. Thus, this invention can support ultra-fine-resolution quantization error cancellation. Moreover, as the noise of the FDTC can be sup pressed by the TA, its power and noise can be reduced.

Aiming at the problems in the existing approach, this invention discloses a multi-band, shared-aperture, circularly polarized phased array antenna. By integrating many circularly polarized phased array antennas with different operation bands into one aperture, a shared-aperture antenna array is achieved. The bandwidth and crossband port isolation of this antenna are enhanced, and the antenna also has the properties of miniaturization, feasibility, of ease of connection with various circuits.

EMBODIMENTS

The invention will be further explained with regard to the accompanying drawings and the following embodiments.

In order to make the purpose, technical scheme, and technical effects of the present invention more clear and complete, the following detailed description of the present invention is provided in conjunction with the accompanying drawings and a non-limiting example.

Figure 1:
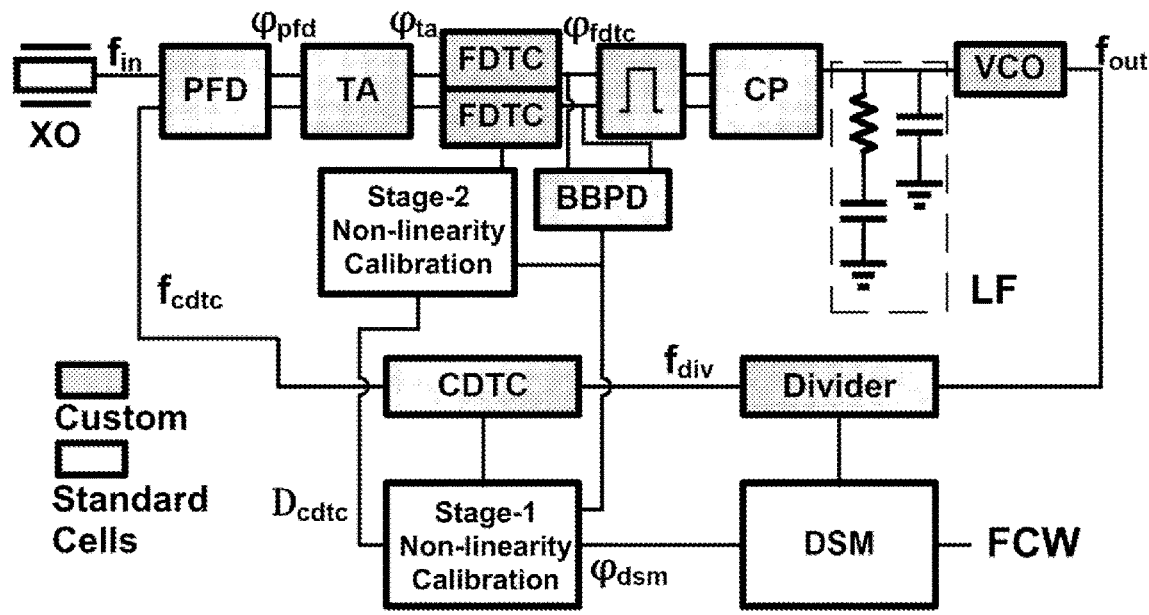
FIG. 1 is a schematic diagram of the low noise millimeter wave frequency synthesizer in the present invention.

This non-limiting example shows a low noise millimeter-wave fractional-N synthesizer as shown in FIG. 1 including a phase-frequency detector (PFD), a time amplifier (TA), a charge pump (CP), a loop filter (LF), a voltage-controlled oscillator (VCO), a divider, a delta-sigma modulator (DSM), a coarse digital-to-time convertor (CDTC), a fine digital-to-time convertor (FDTC) and 2 digital non-linearity calibration circuits. The digital non-linearity calibration circuits comprise a first non-linearity calibration module, a second non-linearity calibration module and a Bang-Bang phase detector (BBPD).

The input signal $f_{in}$ is connected to the crystal oscillator signal input of the FDTC in the phase-locked loop, the output signal of the CDTC is connected to the input of the PFD (divider side), the output signal $\varphi_{pfd}$ of the PFD is connected to the input of the TA to generate an output signal $\varphi_{ta}$. $\varphi_{ta}$ is then connected to the input of the FDTC, which generates an output signal $\varphi_{fdtc}$ and is connected to the input of the CP, the CP generates an output current signal and converts it to a voltage signal $V_{tune}$ by a loop filter, and the voltage signal $V_{tune}$ is connected to the control terminal of the VCO. The VCO generates an output signal $f_{out}$. Meanwhile, the output signal $f_{out}$ is fed back to the input of the divider, the divider generates a divided frequency signal $f_{div}$ which is connected to the input of the CDTC and serves as the clock to drive the DSM. The DSM generates a corresponding phase residual information $\varphi_{dsm}$ and a control signal $N_{div}$ which are connected to the phase residual input of the first DTC non-linearity calibration module and the control terminal of the divider, respectively. The output signal $\varphi_{fdtc}$ is connected to the input terminal of the BBPD and the BBPD extracts the phase error information from $\varphi_{fdtc}$ and connects to the first DTC non-linearity calibration module and the second DTC non-linearity calibration module. The first DTC non-linearity calibration module generates a CDTC control signal and connects it to a CDTC control terminal. The second non-linearity calibration module generates a FDTC control signal and connects it to the FDTC control terminal. In the non-limiting example, The CDTC is configured with 5 bits (32 states) numerical control (NC) range and it can cover a 115 ps NC section. The FDTC is configured with 5 bits (32 states) NC range and it can cover a 120 ps NC section.

Figure 2:
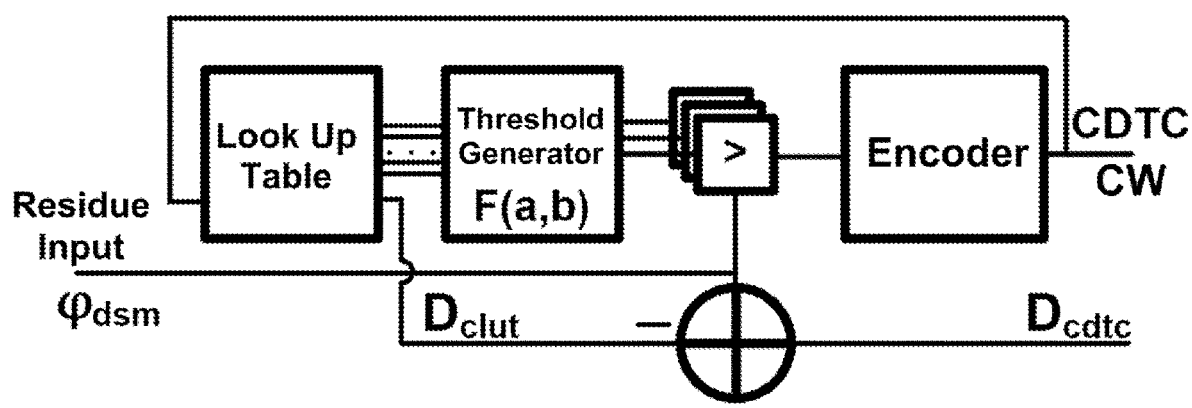
FIG. 2 is a schematic diagram of the first DTC non-linearity calibration module in the present invention.

In some other embodiments, the first DTC non-linearity calibration module comprises: a first DTC compensation module and a first-stage DTC calibration module; wherein the first DTC compensation module as shown in FIG. 2 comprises: a first lookup table, a first threshold calculation module, a first arrayed comparator and a first encoder. The first lookup table which has 32 entries stores delay data for each control word of the corresponding CDTC. The first threshold calculation module uses the equation F(a, b)=(a+b)/2 to calculate the average value of each adjacent delay data in the first lookup table and outputs the calculation result as thresholds. The first arrayed comparator compares thresholds with the phase residue input $\varphi_{dsm}$ from the DSM and the arrayed output is sent to the first encoder. The first encoder which is a priority encoder selects the delay data $D_{clut}$ in the first lookup table which is closest to the phase residue $\varphi_{dsm}$ and outputs the control word corresponding to the delay data $D_{clut}$ as the CDTC control signal. At the same time, the phase residue $\varphi_{dsm}$ minus the delay data $D_{clut}$ is output as the phase residue output $D_{cdtc}$ of the first DTC compensation module, which can be then used as the input of a second DTC compensation module.

Figure 3:
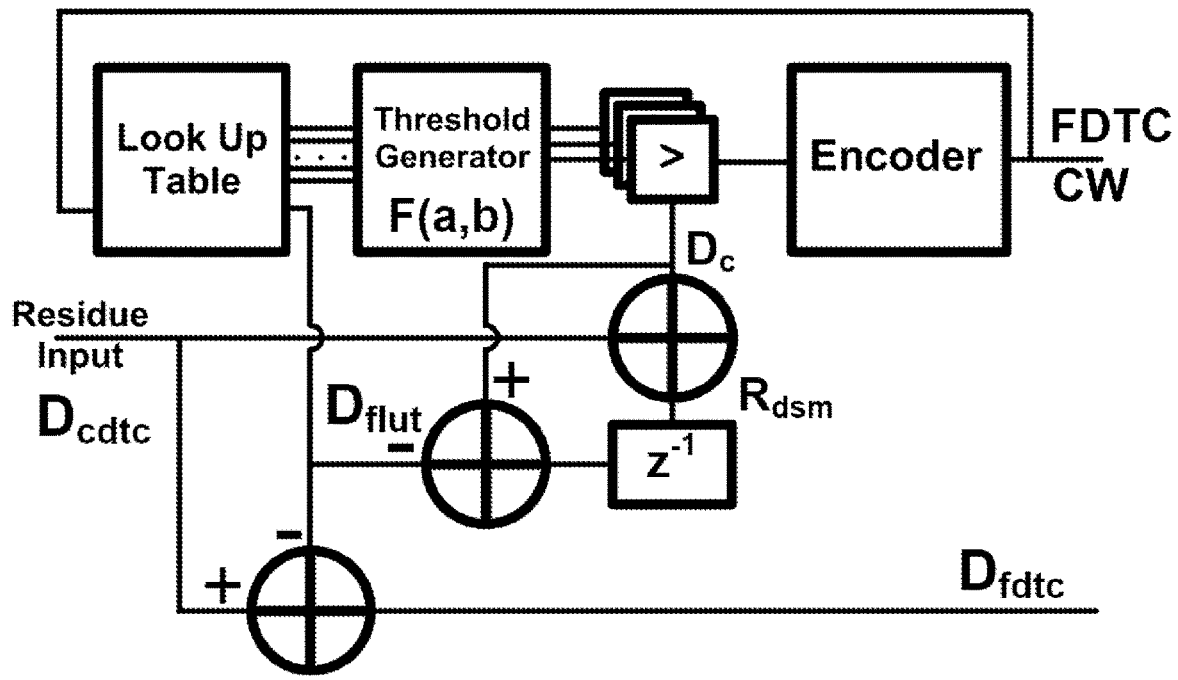
FIG. 3 is a schematic diagram of the second DTC non-linearity calibration module in the present invention.

The second DTC non-linearity calibration module includes the second DTC compensation module and a second DTC calibration module; wherein the second DTC compensation module (e.g., as shown in FIG. 3) includes a second lookup table, a second threshold calculation module, a second arrayed comparator, and a second encoder. The second lookup table, which may have 32 entries, stores delay data for each control word of the corresponding FDTC, and the second threshold calculation module calculates the average value of each adjacent delay data in the second lookup table and outputs the calculation result as thresholds. The phase residual output $D_{cdtc}$ of the first DTC compensation module is added to the current residual $R_{dsm}$ to obtain the pre-compared value $D_c$. $D_c$ is compared with each threshold, and the comparison result is input to the encoder, similar to that in the first DTC non-linearity calibration module. The second encoder selects the delay data $D_{fdtc}$ closest to the compared value $D_c$ in the second lookup table and outputs the control signal of the FDTC corresponding to the control word of the delayed data $D_{fdtc}$; at the same time, the compared value $D_c$ minus the delayed data $D_{flut}$ is used or input as the phase residual $R_{dsm}$ of the next period. The phase residual output $D_{cdtc}$ minus the delayed data $D_{flut}$ is used or input as the phase residual output $D_{flut}$ of the second DTC non-linearity compensation module and is connected to the second DTC calibration module and the first DTC calibration module.

Figure 4:
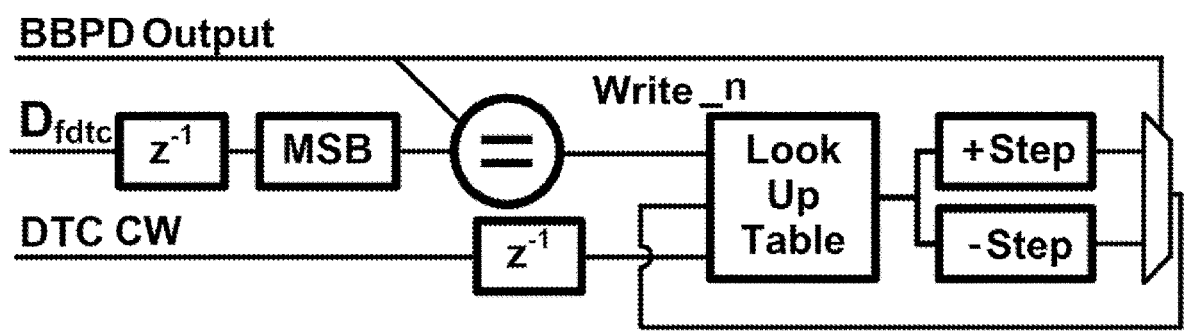
FIG. 4 is a schematic diagram of the DTC calibration module in the present invention.

Furthermore, the second DTC calibration module works the same way as the first DTC calibration module, as shown in FIG. 4. Both compare the sign bit of the phase residue output $D_{fdtc}$ of the second DTC compensation module with the output of the BBPD. When they are different, the lookup tables are updated. When the output of the BBPD is 1, the delay data $D_{clut}$ in the first lookup table and the delay data $D_{flut}$ in the second lookup table are increased according to a preset step size; when the output of the BBPD is 0, the delay data $D_{clut}$ in the first lookup table and the delay data $D_{flut}$ in the second lookup table are decreased according to the same or different preset step size. If both the phase residue output $D_{fdtc}$ and the output of the BBPD are the same, it is unnecessary to update the lookup tables.

Figure 5:
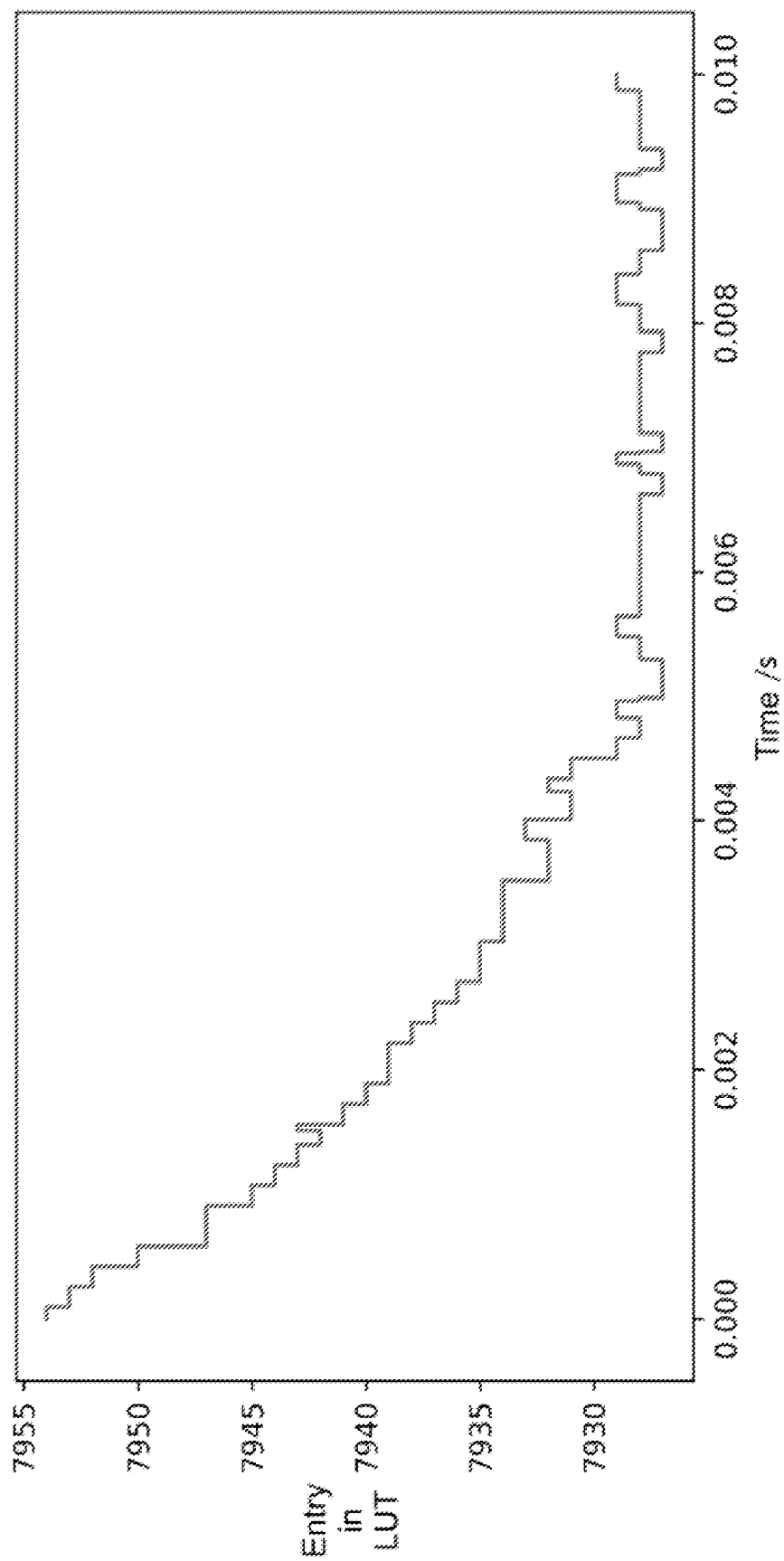
FIG. 5 is a schematic diagram of the convergence process of the DTC calibration module in the present invention.

From the perspective of calibration principle, when the delay data in the lookup table is smaller than reality currently, the threshold calculation module will al so generate a smaller threshold, resulting in a higher actual delay of a DTC (the CD TC or the FDTC). Therefore, there is a higher probability that the BBPD will output a high logic state (e.g., 1), which will be fed back to the calibration module to increase the corresponding delay data in the lookup table. FIG. 5 shows the convergence process of the DTC calibration module, wherein the first entry in the lookup table was taken for convenient illustration, and the convergence process of the remaining registers is similar. As shown in the figure, the calibration value can be well converged within 10 ms.

Figure 6:
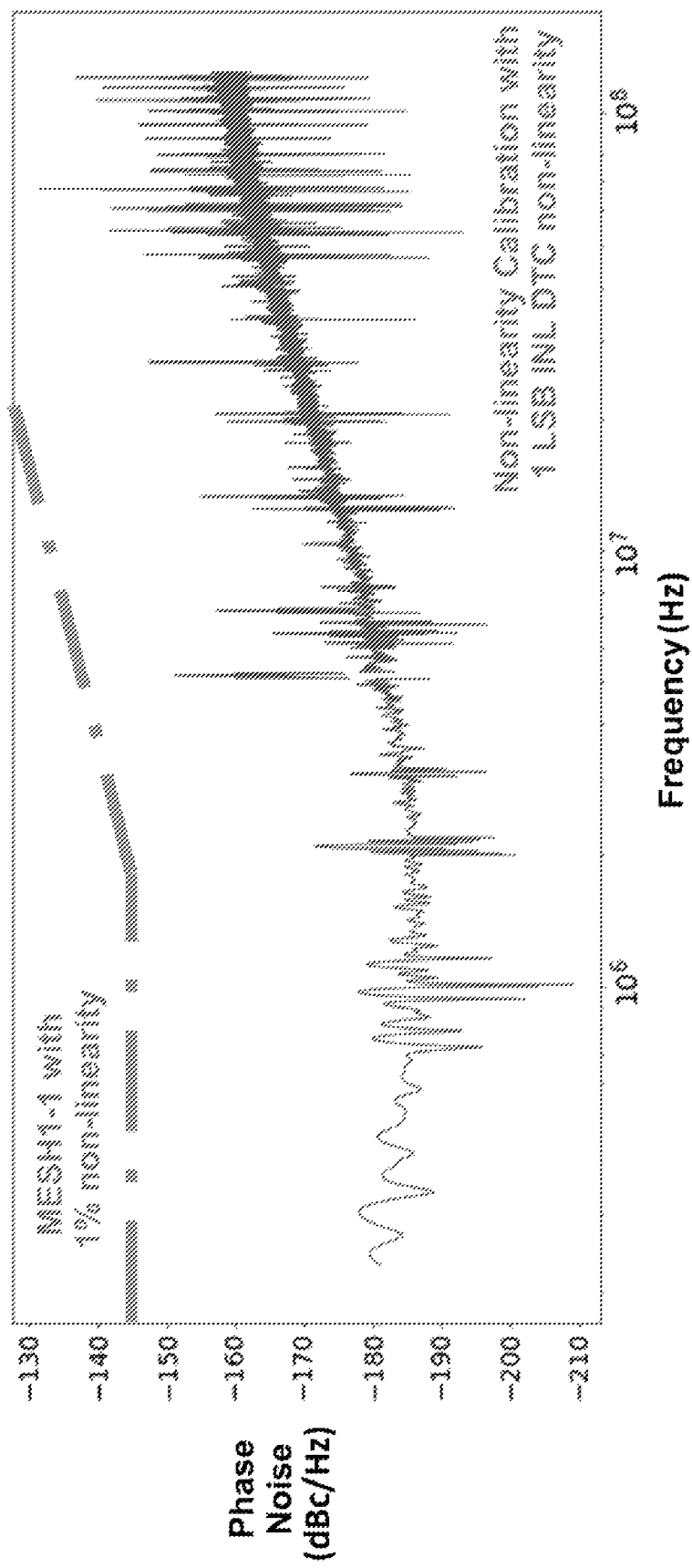
FIG. 6 shows the comparison of input-referred quantization noise (after DTC non-linearity calibration) in the present invention and input-referred quantization noise in conventional MESH 1-1.

FIG. 6 shows the comparison of input-referred quantization noise between the classic MASH1-1-divider-based phase locked loop and this invention. Both of them exhibit second order quantization noise reshaping. The noise in the MASH1-1 case will be greater than −150 dBc/Hz at 1 MHz, while the noise in the non-limiting ex ample is less than −180 dBc/Hz at 1 MHz. This shows that the contribution of quantization noise to the in-band quantization noise of the present invention can be significantly reduced by using the technique in the non-limiting example.

The above description is only a non-limiting example of the present invention. Unless specifically stated, any feature disclosed in this specification can be rep laced by other equivalent or similar purpose features. All features, methods, or steps disclosed in this specification, except for mutually exclusive features and/or steps, can be combined in any way.

The embodiments of the present invention have been described here with reference to specific examples. Those skilled in the art can easily understand the ad vantages and effects of the present invention by the contents disclosed in these embodiments. The present invention may also be implemented or applied through other different specific embodiments. The various details in these embodiments can also be modified or changed on the basis of different opinions or applications without departing from the spirit of the present invention.

What is claimed:

1. A low-noise millimeter-wave fractional-N frequency synthesizer, comprising a phase-frequency detector (PFD), a time amplifier (TA), a charge pump (CP), a loop filter (LF), a voltage-controlled oscillator (VCO), a divider and a delta-sigma modulator (DSM), a coarse digital-to-time convertor (CDTC), a fine digital-to-time convertor (FDTC) and two digital non-linearity calibration circuits, wherein:
   an input of the CDTC is connected to an output of the divider and an output of CDTC is connected to an input of the PFD, an input of the FDTC is connected to an output of the TA and an output of the FDTC is connected to an input of the CP, the digital non-linearity calibration circuits comprise a first non-linearity calibration module, a second non-linearity calibration module and a bang-bang phase detector (BBPD), an output signal of the PFD is connected to an input of the bang-bang phase detector, and the bang-bang phase detector extracts phase error information and connects it to each of the two digital non-linearity calibration circuits, the first non-linearity calibration module generates a first control code for the CDTC and is connected to a control terminal of the CDTC, and the second non-linearity calibration module generates a second control code for the FDTC and is connected to a control terminal of the FDTC.

2. The low-noise millimeter-wave fractional-N frequency synthesizer according to claim 1, wherein an input signal $f_{in}$ is connected to a crystal oscillator signal input of the FDTC, an output signal $\varphi_{pfd}$ of the PFD is connected to an input of the TA to generate an output signal $\varphi_{ta}$, the output signal $\varphi_{ta}$ is connected to the input of the FDTC, which generates an output signal $\varphi_{fdtc}$ and is connected to the input of the CP.

3. The low-noise millimeter-wave fractional-N frequency synthesizer according to claim 2, wherein the CP generates an output current signal and converts it to a voltage signal $V_{tune}$ by the loop filter, and the voltage signal $V_{tune}$ is connected to a control terminal of the VCO, the VCO generates an output signal $f_{out}$.

4. The low-noise millimeter-wave fractional-N frequency synthesizer according to claim 2, wherein the output signal $f_{out}$ is fed back to an input of the divider, the divider generates a divided frequency signal $f_{div}$ that is connected to the input of the CDTC and serves as a clock for digital circuits, and the DSM generates a corresponding phase residual information $\varphi_{dsm}$ and a control signal $N_{div}$, which are connected to a phase residual input of the first non-linearity calibration module and a control terminal of the divider, respectively.

5. The low-noise millimeter-wave fractional-N frequency synthesizer according to claim 1, wherein the first non-linearity calibration module comprises: a first DTC compensation module and a first DTC calibration module.

6. The low-noise millimeter-wave fractional-N frequency synthesizer according to claim 5, wherein the first DTC compensation module comprises: a first lookup table, a first threshold calculation module, a first arrayed comparator and a first encoder.

7. The low-noise millimeter-wave fractional-N frequency synthesizer according to claim 6, wherein the first lookup table stores delay data for each control word of the corresponding CDTC, the threshold calculation module calculates the average value of each adjacent delay data in the first lookup table and outputs the calculation result as thresholds, and the first arrayed comparator compares a search threshold with the phase residue input $\varphi_{dsm}$ from the DSM and sends an arrayed output to the encoder.

8. The low-noise millimeter-wave fractional-N frequency synthesizer according to claim 7, wherein the encoder selects a delay data $D_{clut}$ in the first lookup table which is closest to the phase residue $\varphi_{dsm}$ and outputs the control word corresponding to the delay data $D_{clut}$ as a CDTC control signal.

9. The low-noise millimeter-wave fractional-N frequency synthesizer according to claim 8, wherein the encoder comprises a priority encoder or an adder.

10. The low-noise millimeter-wave fractional-N frequency synthesizer according to claim 8, wherein the phase residue $\varphi_{dsm}$ minus the delay data $D_{clut}$ is output as a phase residue output $D_{cdtc}$ of the first DTC compensation module.

11. The low-noise millimeter-wave fractional-N frequency synthesizer according to claim 5, wherein the second non-linearity calibration module includes: a second DTC compensation module and a second DTC calibration module.

12. The low-noise millimeter-wave fractional-N frequency synthesizer according to claim 11, wherein the second DTC compensation module includes: a second lookup table, a second threshold calculation module, a second arrayed comparator, and a second encoder.

13. The low-noise millimeter-wave fractional-N frequency synthesizer according to claim 12, wherein the second lookup table stores delay data for each control word of the corresponding FDTC, and the threshold calculation module calculates an average value of each adjacent delay data in the second lookup table and outputs the calculation result as thresholds.

14. The low-noise millimeter-wave fractional-N frequency synthesizer according to claim 13, wherein a first phase residual output $D_{cdtc}$ of the first DTC compensation module is added to a current residual $R_{dsm}$ to obtain a pre-compared value $D_c$, $D_c$ is compared with each threshold, and a comparison result is input to the second encoder.

15. The noise millimeter-wave fractional-N frequency synthesizer according to claim 14, wherein the second encoder selects the delay data $D_{fdtc}$ closest to the compared value $D_c$ in the second lookup table and outputs a control signal of the FDTC corresponding to a control word of delayed data $D_{fdtc}$.

16. The noise millimeter-wave fractional-N frequency synthesizer according to claim 15, wherein a compared value De minus delayed data $D_{flut}$ comprises a phase residual $R_{dsm}$ of a next period, and the first phase residual output $D_{cdtc}$ minus the delayed data $D_{flut}$ is a second phase residual output $D_{fdtc}$ of the second DTC non-linearity compensation module.

17. The low noise millimeter-wave fractional-N frequency synthesizer according to claim 16, wherein the first DTC calibration module compares a sign bit of the second phase residue output $D_{fdtc}$ with the output of the BBPD.

18. The low noise millimeter-wave fractional-N frequency synthesizer according to claim 17, wherein when the sign bit of the second phase residue output $D_{fdtc}$ and the output of the BBPD are different, the first lookup table is updated such that when the output of the BBPD is 1, the delay data $D_{clut}$ in the first lookup table is increased according to a first preset step size, and when the output of the BBPD is 0, the delay data $D_{clut}$ in the first lookup table is decreased according to a second preset step size.

19. The low noise millimeter-wave fractional-N frequency synthesizer according to claim 17, wherein the second DTC calibration module compares the sign bit of the second phase residue output $D_{fdtc}$ with the output of the BBPD.

20. The low noise millimeter-wave fractional-N frequency synthesizer according to claim 19, wherein when the sign bit of the second phase residue output $D_{fdtc}$ and the output of the BBPD are different, the second lookup table is updated such that when the output of the BBPD is 1, the delay data $D_{flut}$ in the second lookup table is increased according to a third preset step size, and when the output of the BBPD is 0, the delay data $D_{flut}$ in the second lookup table is decreased according to a fourth preset step size.

* * * * *